(12) United States Patent
Kato et al.

(10) Patent No.: US 9,043,675 B2
(45) Date of Patent: May 26, 2015

(54) STORAGE DEVICE

(75) Inventors: Takeaki Kato, Kanagawa-ken (JP);
Hitoshi Shimono, Kanagawa-ken (JP);
Akinori Kamizono, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 133 days.

(21) Appl. No.: 13/600,124

(22) Filed: Aug. 30, 2012

(65) Prior Publication Data

US 2013/0219244 A1  Aug. 22, 2013

(30) Foreign Application Priority Data

Feb. 17, 2012 (JP) ................ P2012-033313

(51) Int. Cl.
*G11C 29/00* (2006.01)
*G06F 11/10* (2006.01)
*H03M 13/05* (2006.01)

(52) U.S. Cl.
CPC .......... *G06F 11/1048* (2013.01); *H03M 13/05* (2013.01)

(58) Field of Classification Search
CPC . G06F 11/1048; G06F 11/10; G06F 11/1044; G06F 11/1076; G06F 12/0292; G06F 3/0613; G06F 3/0616; G06F 3/064; G06F 3/0658; G06F 3/0664; G06F 12/0246; G06F 3/0688; G06F 2212/7201; G06F 2212/7208; G06F 2212/7211; H03M 13/05; G11C 13/0004
See application file for complete search history.

(56) References Cited

U.S. PATENT DOCUMENTS

| 2008/0320214 A1* | 12/2008 | Ma et al. ................. 711/103 |
| 2009/0055680 A1 | 2/2009 | Honda et al. |
| 2009/0198881 A1* | 8/2009 | Toda .................. 711/108 |
| 2010/0191897 A1 | 7/2010 | Zhang et al. |
| 2010/0274952 A1* | 10/2010 | Lee .................. 711/103 |
| 2011/0238898 A1* | 9/2011 | Honda |
| 2012/0304039 A1* | 11/2012 | Peterson et al. ........... 714/773 |

FOREIGN PATENT DOCUMENTS

| JP | 08-235028 | 9/1996 |
| JP | 2007148965 A | 6/2007 |
| JP | 2008009614 A | 1/2008 |
| JP | 2010-160816 | 7/2010 |
| WO | 2005111812 | 11/2005 |
| WO | 2006/071241 A2 | 7/2006 |
| WO | 2007/010829 A1 | 1/2007 |

OTHER PUBLICATIONS

Japanese Office Action for JP application No. 2012-033313, mailed Jun. 17, 2014.

* cited by examiner

*Primary Examiner* — Guerrier Merant
(74) *Attorney, Agent, or Firm* — Patterson & Sheridan, LLP

(57) ABSTRACT

A nonvolatile memory is configured with blocks as deletion units, each block having several pages that are configured as write units. A controller for the nonvolatile memory includes an error correcting circuit, which detects and corrects an error in data read out of a page in one of the blocks of the nonvolatile memory, the page being referenced by a logical address. The controller also determines an error occurrence when the error cannot be corrected. An error block table is provided to store the logical address where the error occurred, and a physical address corresponding to the logical address.

7 Claims, 8 Drawing Sheets

*Fig. 4*

ERROR BLOCK TABLE

| LOGICAL ADDRESS | PHYSICAL ADDRESS |
|---|---|
| 0xAAAAAAAA | 0xXXXXXXXX |
| 0xBBBBBBBB | 0xYYYYYYYY |
| ⋮ | ⋮ |
| ⋮ | ⋮ |
|  |  |

ERROR BLOCK TABLE

| LOGICAL ADDRESS | PHYSICAL ADDRESS | STATE HOLD FLAG |
|---|---|---|
| 0xAAAAAAAA | 0xXXXXXXXX | 0x00 |
| 0xBBBBBBBB | 0xYYYYYYYY | 0x00 |
| 0xBBBBBBBB | 0xYYYYYYYY | 0xFF |
| ⋮ | ⋮ | ⋮ |
| ⋮ | ⋮ | ⋮ |
|  |  |  |

STORAGE DEVICE

CROSS-REFERENCE TO RELATED APPLICATION

This application is based upon and claims the benefit of priority from Japanese Patent Application No. 2012-033313, filed Feb. 17, 2012; the overall contents of which are incorporated herein by reference.

FIELD

Embodiments described herein relate to a storage device, in which a nonvolatile memory is implemented.

BACKGROUND

In storage devices in which a nonvolatile memory (for example, NAND type flash memory) is implemented, for example, in memory cards such as SD (Secure Digital) card, it is generally assumed that a bit error may occur.

For example, in the NAND type flash memory, an error may be generated by data contamination (data retention), which is caused by electrons stored in a floating gate that escape naturally or by data contamination (read disturbance) due to the stress of repetition, etc., of reading of the same block. For this reason, it is common, when using flash memory, to correct such bit errors by an error correction technique using an ECC (error checking and correction) circuit.

Although the correctability of the ECC circuit depends upon the algorithm of the ECC, the bit error can be completely corrected so long as the bit error is within a correctable range of the algorithm.

On the other hand, when the bit error exceeds the correctable range of the algorithm, the ECC circuit cannot completely correct the bit error, and a controller for the memory unit is notified of the occurrence of the error. In such a case, the memory unit cannot output correct data but notifies a host device of the occurrence of the error. Hereinafter, the error notified from the ECC circuit after the occurrence of an uncorrectable error in the ECC circuit will be referred to as an ECC error.

When bit errors are severe enough to cause ECC errors, various problems may be the cause and should be investigated. For example, there may be a problem with data retention or read disturbance (this is a NAND memory cell problem due to a process during the manufacture), or a problem with the firmware for controlling the NAND type flash memory, or there may be a problem due to an access pattern of the host device, or the NAND type flash memory may have reached end of life.

Sometimes, it is necessary to investigate the cause of the occurrence of the ECC error, in which case a physical block in the NAND type flash memory in which the ECC error has occurred is required to be known. In case the physical block associated with the ECC error is the physical block in which the ECC error has occurred initially, it is easy to identify the physical block.

However, in some instances, the physical block associated with the ECC error is copied to another physical block as part of a background process, depending upon the algorithm of firmware that is implemented by the controller. Consequently, in such cases, the physical block associated with the ECC error is no longer the physical block in which the ECC error initially occurred.

For example, in the case where the ECC error has occurred in the data of an address written in a certain physical block, when additional data are written in the same physical block in portions of the physical block other than the physical address at which the ECC error has occurred, the additional data are not written to that physical block. Instead, the additional data and the data in which the ECC error has occurred are written to a new physical block, due to the characteristics of NAND type flash memory. Thus, data in which the ECC error has occurred are copied from the original physical block to the new physical block. Next, after copying the data in which the ECC error has occurred to the new physical block and writing the new data to the new physical block, a table showing the correlation between logical addresses and physical addresses is updated accordingly.

In this case, since the correlation of the logical address and the physical block in which the ECC error has actually occurred is overwritten, it is difficult to identify the physical block in which the ECC error has actually occurred.

A technique for registering/managing the physical block has been proposed when an ECC error has occurred; however when the ECC error occurs in reading a specific block of the NAND type flash memory, the block is the only block that is undergoing such registration/management. For this reason, if another physical block is copied in a background process and the physical block is changed, it is still not possible to identify the physical block in which the ECC error has actually occurred.

DESCRIPTION OF THE DRAWINGS

FIG. 4 shows the configuration of an error block table in the first embodiment.

DETAILED DESCRIPTION

In general, embodiments will be explained with reference to the FIGS. Here, as the storage device, a memory card such as an SD card in which a nonvolatile memory such as NAND type flash memory is mounted is adopted as an example. In the following embodiments, without being limited to the SD card, storage devices provided with other nonvolatile memories, for example, multimedia card, USB flash memory, SSD (solid state drive), etc., can also be applied. In the following explanation, the same symbols will be given to constituent elements with the same functions and configurations, and their overlapping explanation will be carried out, only if necessary.

According to the embodiments, there is provided a storage device that identifies a physical block in which an error has actually occurred, even when data that caused the ECC error have been copied to a different physical block.

In one embodiment, the storage device is provided with a nonvolatile memory and a controller for controlling the nonvolatile memory, and the nonvolatile memory includes several blocks as deletion units, where each block has several pages as write units. The controller is provided with an error correcting circuit, which detects and corrects an error for data read out of the block of the nonvolatile memory designated by a logical address and notifies the controller of an error occurrence when the error cannot be corrected, and a processing circuit for controlling the operations of the error correcting circuit and the nonvolatile memory. When the notification of the error occurrence is received from the error correcting circuit, the processing circuit generates an error block table in which the logical address where the error occurred and a physical address corresponding to the logical address, are registered.

(Embodiment 1)

In a first embodiment, an error block table is managed with system data that are in firmware for controlling a memory card. The error block table contains a logical block, in which an ECC error has occurred, and a physical block corresponding to the logical block. The error block table facilitates identification of the physical block in which the error has occurred.

Figure 1:
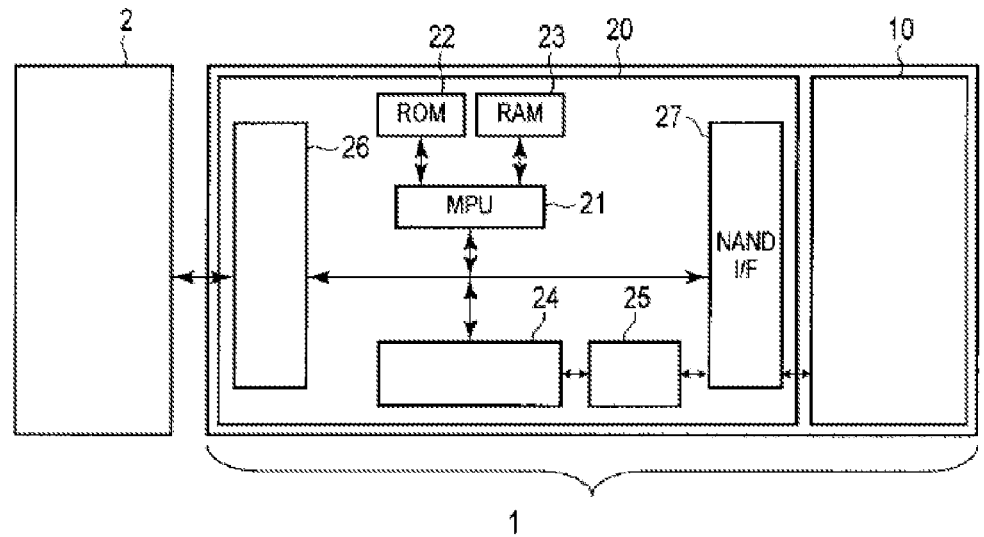
FIG. 1 is a block diagram showing the configuration of a memory card of a first embodiment.

FIG. 1 is a block diagram showing the overall configuration of the memory card of the first embodiment.

As shown in FIG. 1, the memory card 1 includes a nonvolatile memory as a device for storing data, for example, a NAND type flash memory 10, and a memory controller 20 for controlling the memory. The memory controller 20 is provided with a processing circuit such as microprocessing unit (MPU) 21, read-only memory (ROM) 22, random access memory (RAM) 23, data buffer 24, error correcting circuit such as error checking and correction (ECC) circuit 25, host interface (host I/F) 26, and NAND interface (NAND I/F) 27. The memory card 1 is loaded into a host device 2 and implements a processing corresponding to the access from the host device 2.

The firmware as a control program of the memory controller 20 is recorded in the ROM 22 or NAND type flash memory 10 in the controller 20, read out, and utilized.

The MPU 21 controls write, readout, and deletion operations on the memory controller 20 based on the firmware. The ROM 22 is a memory for storing control programs that are used in the MPU 21. The RAM 23 is a volatile memory that is used as a work area of the MPU 21 and stores the control programs or various kinds of tables. The data buffer 24 is a storage area for temporarily storing data at the time of write and readout.

The ECC circuit 25 has the function of rendering an ECC code to the data that is written. In addition, the ECC circuit 25 has the function of detecting an error, correcting the error, and notifying that the data read out of the NAND type flash memory 10 has an error. In other words, the ECC circuit 25 detects an error on read data, and if an error exists, the error is corrected. Moreover, if the detected error exceeds a correctable range, the memory controller 20 is notified of the occurrence of the error.

The host interface 26 implements an interface processing between the memory controller 20 and the host device 2. The NAND interface 27 implements an interface for processing between the memory controller 20 and the NAND type flash memory.

Figure 2:
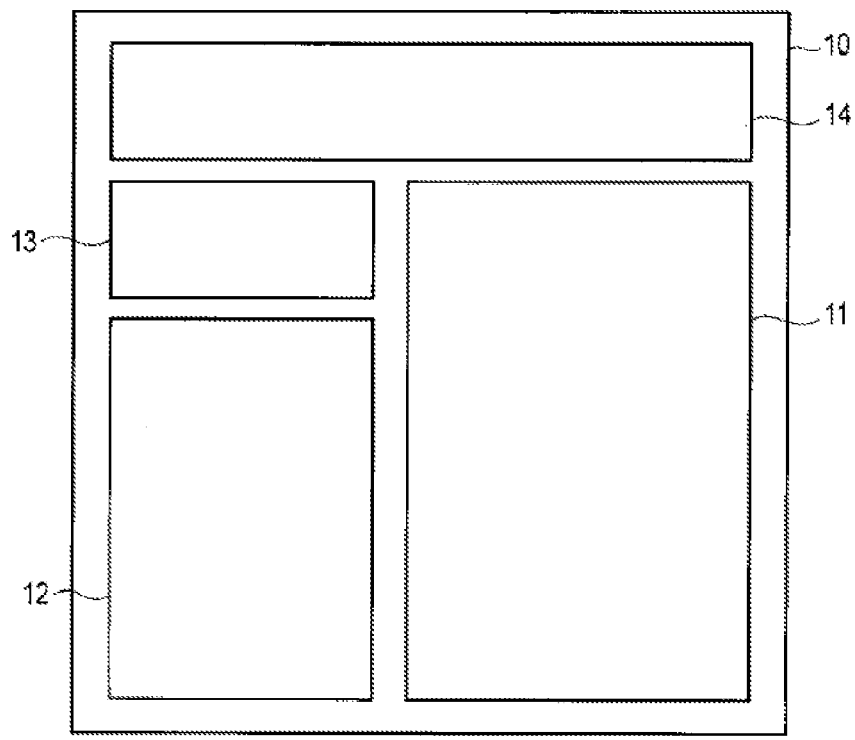
FIG. 2 shows a storage area in a NAND type flash memory of the first embodiment.

FIG. 2 outlines a storage area in the NAND type flash memory.

A storage area of the NAND type flash memory 10 in the memory card 1 includes user area 11, secure area 12, various kinds of registers 13, and system area 14. The user area 11 stores ordinary data. The secure area 12 stores data with high security. Various kinds of registers 13 store various kinds of operation information. The system area 14 stores firmware or other system data that are implemented in the memory controller 20 to control the NAND type flash memory 10.

In general, a logical block address, which is defined by the memory controller 20, is used in the data transfer between the host device 2 and the memory card 1. This logical block address is mapped one-to-one with a physical block address as an actual address in the NAND type flash memory 10. A mapping table (logical transformation table) for mapping logical block address and physical block addresses is managed in the system area 14 in the NAND type flash memory 10. In addition, the physical block addresses to the logical block addresses are not necessarily arranged sequentially from 1, and there is a possibility that various physical block addresses are allocated in accordance with the situation.

Figure 3:
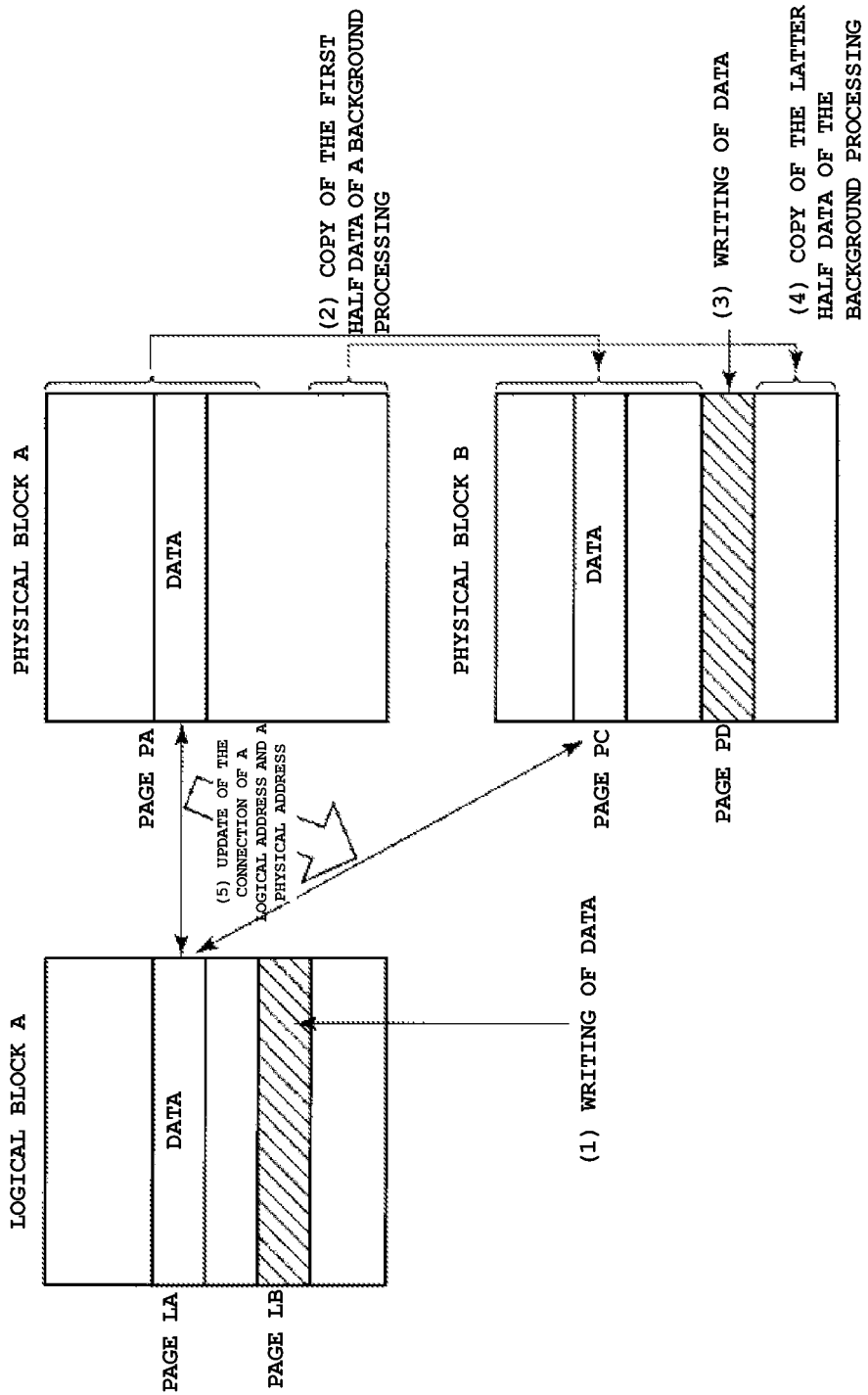
FIG. 3 shows a background process that is implemented in the NAND type flash memory of the first embodiment.

FIG. 3 shows a state in which mapping changes from a certain physical block to another physical block in a background process that is implemented in the NAND type flash memory 10.

For example, data exist in a page address LA of a certain logical block A, and this page address is mapped to a page address PA of a physical block A.

Here, (1) when writing new data to another page address LB of the logical block A, and since the NAND type flash memory 10 cannot overwrite specific pages of a given physical block, it is necessary to prepare a new physical block B and to merge new write data and the pre-existing data.

In the physical block B, first, (2) the data in physical block A before the write data is copied from the physical block A. At that time, the data of the page PA, which have already existed, are also included. Next, for the data read out of the physical block A, the ECC circuit 25 may detect an error. If the error detected does not exceed a correctable range, the ECC circuit 25 corrects the error and generates a new ECC code based on the data after correcting. This new ECC code and the data after correcting are written into the physical block B. If the error detected exceeds the correctable range, the ECC circuit 25 indicates an ECC error and generates a new ECC code based on data containing a bit error. The data containing the new ECC code and the bit error are written into the physical block B. At that time, the controller 20 sets a flag to indicate that the ECC error occurred in the past.

Next, (3) the write data are written into a page PD of the physical block B. Next, (4) the data in the physical block A after the write data is copied from the physical block A. At that time, the ECC circuit 25 is operated similarly to the operation explained in (2).

Finally, (5) the mapping of the logical block addresses and the physical block addresses is updated, completing the processing. In the example of FIG. 3, the mapping with the page LA of the logical block A is updated to the page PC of the physical block B from the page PA of the physical block A. Therefore, a physical block address corresponding to a certain logical block address is changed.

If the physical block containing an ECC error is associated with the page LA of the logical block A and the page PA of the physical block A, since the physical block in which the ECC error has occurred has actually changed, it is difficult to identify an actual physical block containing the ECC error. Specifically, when data are copied in the page PC of the physical block from the page PA of the physical block A, the ECC circuit 25 newly generates an ECC code from the data in which the ECC error has occurred. For this reason, even if the ECC code is read out of the page PC, the ECC circuit 25 cannot detect the error based on the ECC code unless a new bit error occurs. At that time, the controller 20 can detect from the flag that the ECC error in the data stored in the page PC occurred in the past. However, since the flag only indicates the existence of the ECC error, the specific physical block that has caused the occurrence of the ECC error cannot be identified.

Accordingly, in this embodiment, an error block table is prepared on the system area 14 of the NAND type flash memory 10, and a logical block containing an ECC error and a physical block corresponding to the logical block are managed using that table, so that the physical block in which the ECC error has actually occurred can be identified.

FIG. 4 shows one embodiment of an error block table for recording a block in which an ECC error has occurred. In the error block table, a logical block address, at which the ECC error has occurred, and a physical block address mapped to the logical block address are recorded and managed. In other words, the logical block address, at which the ECC error has occurred, and the physical block corresponding to the logical block address are registered and managed.

Figure 5:
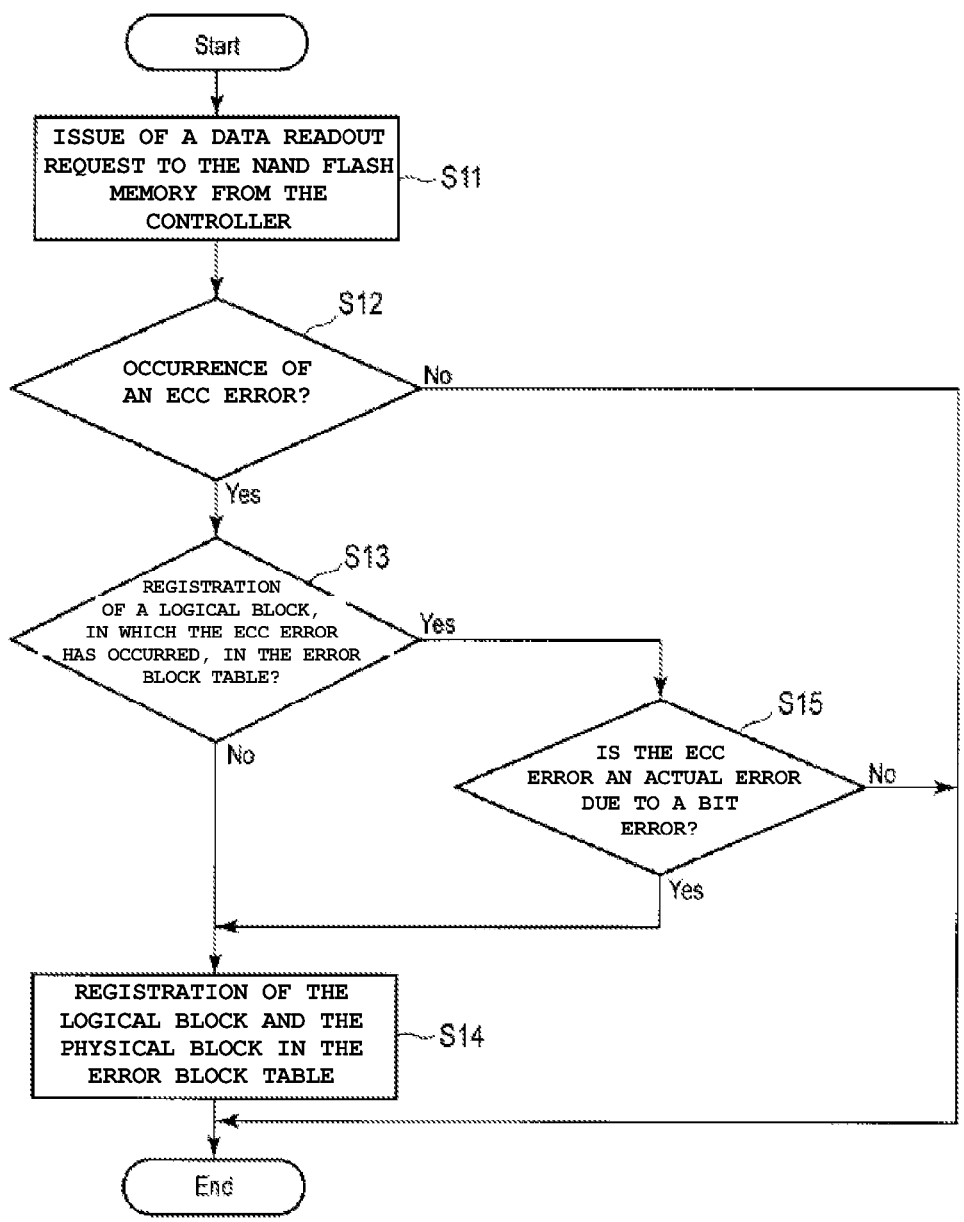
FIG. 5 is a flow chart showing the case in which addresses are registered in an error block table in the first embodiment.

FIG. 5 is a flow chart showing the case in which addresses are registered in the error block table shown in FIG. 4.

First, the controller 20 issues a readout request to the NAND type flash memory 10 (step S11). Next, it is decided whether or not an ECC error occurs in the read (step S12). Specifically, the controller 20 decides whether or not an uncorrectable error is included in data read out of a selected physical block and whether or not a flag showing that the ECC error occurred in the past is set among flags which are managed by firmware for the controller 20. Next, for the case in which the uncorrectable error is included or the case in which the flag is set, it is decided whether the ECC error occurs.

If the ECC error occurs in the data read out of the NAND type flash memory 10, the controller 20 decides whether or not a logical block address at which the ECC error has occurred is registered in the error block table (step S13).

If the same logical block address is not registered in the error block table, the logical block address, at which the ECC error has occurred, and its corresponding physical block address are registered in the error block table (step S14).

At step S13, if the same logical block address is registered in the error block table, the controller 20 decides whether or not the ECC error that occurred is an actual ECC error containing an uncorrectable error. In other words, when an ECC code is recalculated for the read data, which correspond to data copied from the physical block containing the ECC error, and an error is detected, the controller 20 decides whether or not the data include an uncorrectable error. Next, the controller 20 decides, among the flags that are managed by the firmware, whether or not a flag showing that an ECC error occurred in the past, is set. When only the read data include the uncorrectable error (i.e., ECC error did not occur in the past) is the error decided as an actual ECC error (step S15).

If the ECC error that occurred is an actual ECC error, similar to the case in which there is no registration of a logical block address in the error block table, the logical block address and its corresponding physical block address are registered in the error block table (step S14).

On the other hand, if the ECC error that occurred is not an actual ECC error, the logical block address is not registered, for example, when the read data are copied from the physical block containing the ECC error and that read data does not include a new bit error. The firmware decides that the selected physical block includes the ECC error by the flag showing that the ECC error occurred in the past.

The above processing flow is a processing flow when addresses are registered in the error block table.

In the first embodiment, the error block table in which a logical block address, where an error has occurred, and a physical block address corresponding to the logical block address are registered is provided. Thus, when an error has occurred at the time of access to a nonvolatile memory, the physical block in which the error has actually occurred can be retraced, thereby making it possible to identify the physical block.

In addition, as another process when addresses are registered in the error block table, all of the logical block addresses and physical block addresses, at which an error has occurred, may also be registered in the error block table.

Figure 6:
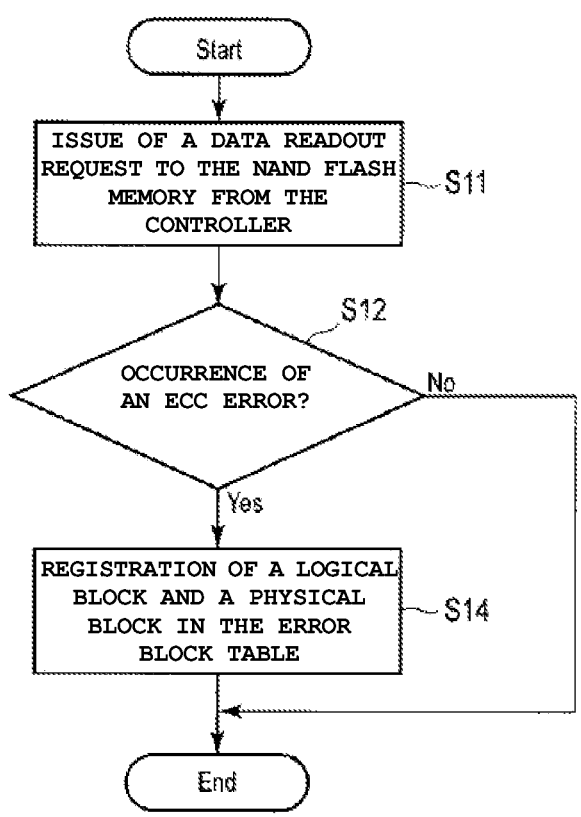
FIG. 6 is another flow chart showing the case in which addresses are registered in the error block table in the first embodiment.

FIG. 6 is a flow chart showing the case in which all addresses, at which an error has occurred, are registered in the error block table in the first embodiment.

In FIG. 5, if the ECC error is not an actual ECC error, no address has been registered in the error block table, finishing the processing. However, in the process shown in FIG. 6, whether or not an ECC error occurs in read data is decided (step S12), and all of the logical block addresses, at which the ECC error has occurred, and their corresponding physical block addresses are registered in the error block table.

Therefore, the registration of all of the logical block address, at which the ECC error has occurred, and the physical block addresses records the transition of the addresses at which the ECC error has occurred. In other words, for the logical block address where the ECC error has occurred, the history of the physical addresses at which the logical block addresses have been used, as well as the physical block address containing an actual error as its origin is recorded. If this history is interpreted, the occurrence sequence of the error can be confirmed.

Figures 7, 8:
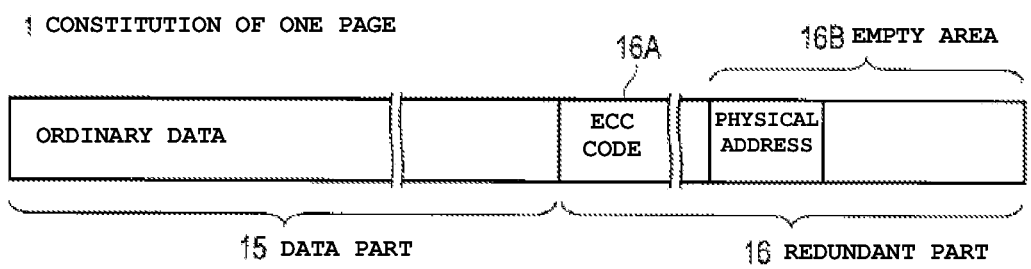
FIG. 7 shows another configuration of the error block table in the first embodiment.
FIG. 8 shows the configuration of a page prepared in a memory card of a second embodiment.

In addition, as shown in FIG. 7, a flag showing whether or not the physical block maintains an ECC error-occurrence state may also be registered in the error block table shown in FIG. 4.

When deletion or overwriting is generated, the state of its physical block can be changed, although it depends upon the firmware of the controller 20. For this reason, for example, the state hold flag showing the state of a physical block is prepared for 1 byte. When the ECC error occurrence state is held, the flag is set to "0x00," and when the ECC error occurrence is not held, the flag is set to "0xFF."

When the initial data are held, the state hold flag is set to "0x00," and when a write process into the memory card is generated, the physical block addresses of the error block table are retrieved. If the same physical block address has already been registered in the error block table, the logical block address to be retrieved, its physical block address, and its state hold flag "0xFF" are newly registered in the error block table. The reason for this new registration is that overwriting is impossible in terms of the characteristics of the NAND type flash memory.

Each time deletion and write are carried out, as mentioned above, if a logical block address, its physical block address, and its state hold flag are registered in the error block table, the lowest entry of the registered entry is always updated. For this reason, even if overlapping logical block addresses and physical block addresses exist, the newest registration information can be decided. Since the state hold flag is prepared in the error block table, whether or not data of the corresponding physical block are stored is understood, thus being useful for the interpretation of the physical block in which the error has occurred.

According to the first embodiment, an error block table is prepared, and a logical address and a physical address corresponding to the logical address are managed by the error block table, thus being able to identify the physical block in which an ECC error has actually occurred. In addition, if the physical addresses of the process are also similarly registered in addition to the registration of the physical address at which the ECC error has actually occurred, the access sequence can be confirmed.

Moreover, since a state hold flag is recorded in the error block table, it can be confirmed whether or not the data remain as in the physical block in which the error has occurred, thus being useful for the interpretation of the error occurrence. In this embodiment, the physical block in which the ECC has actually occurred can be identified by retracing from the physical block that is currently used.

(Embodiment 2)

In a second embodiment, a physical block in which an ECC error has occurred can be identified by registering address information of an ECC error in a redundant part of pages prepared in a NAND type flash memory.

FIG. 8 shows the configuration of a page prepared in a memory card of the second embodiment.

The NAND type flash memory 10 has several blocks as deletion units, and each block has several pages as write units. The page of the NAND type flash memory 10, as shown in FIG. 8, includes a data part 15 in which ordinary data are stored, and a redundant part 16. The redundant part 16 has an area 16A, where an ECC code is stored, and an empty area 16B. In the second embodiment, a physical block address, at which an ECC error has occurred, is stored in the empty area 16B of the redundant part 16 of the page. Therefore, since the physical block address, at which the ECC error has occurred, is registered in the empty area 16B included in the page redundant part 16, the controller 20 manages the physical block address at which the ECC error has occurred.

In case a readout request is issued to the NAND type flash memory 10 from the memory controller 20 and an ECC error has occurred in data read out of the NAND type flash type memory 10, the physical block address, in which the ECC error has occurred, is registered in the page redundant part 16.

On the other hand, for example, in case an ECC error has occurred by a direct readout request from a host device, a physical block address corresponding to its logical block address is not particularly registered. The reason for this is that if the same logical block address is read out, an ECC error occurs, while if a table (logical transformation table) for associating logical block addresses and physical block addresses is confirmed, the physical block address, at which the ECC error has occurred, can be identified.

Figure 9:
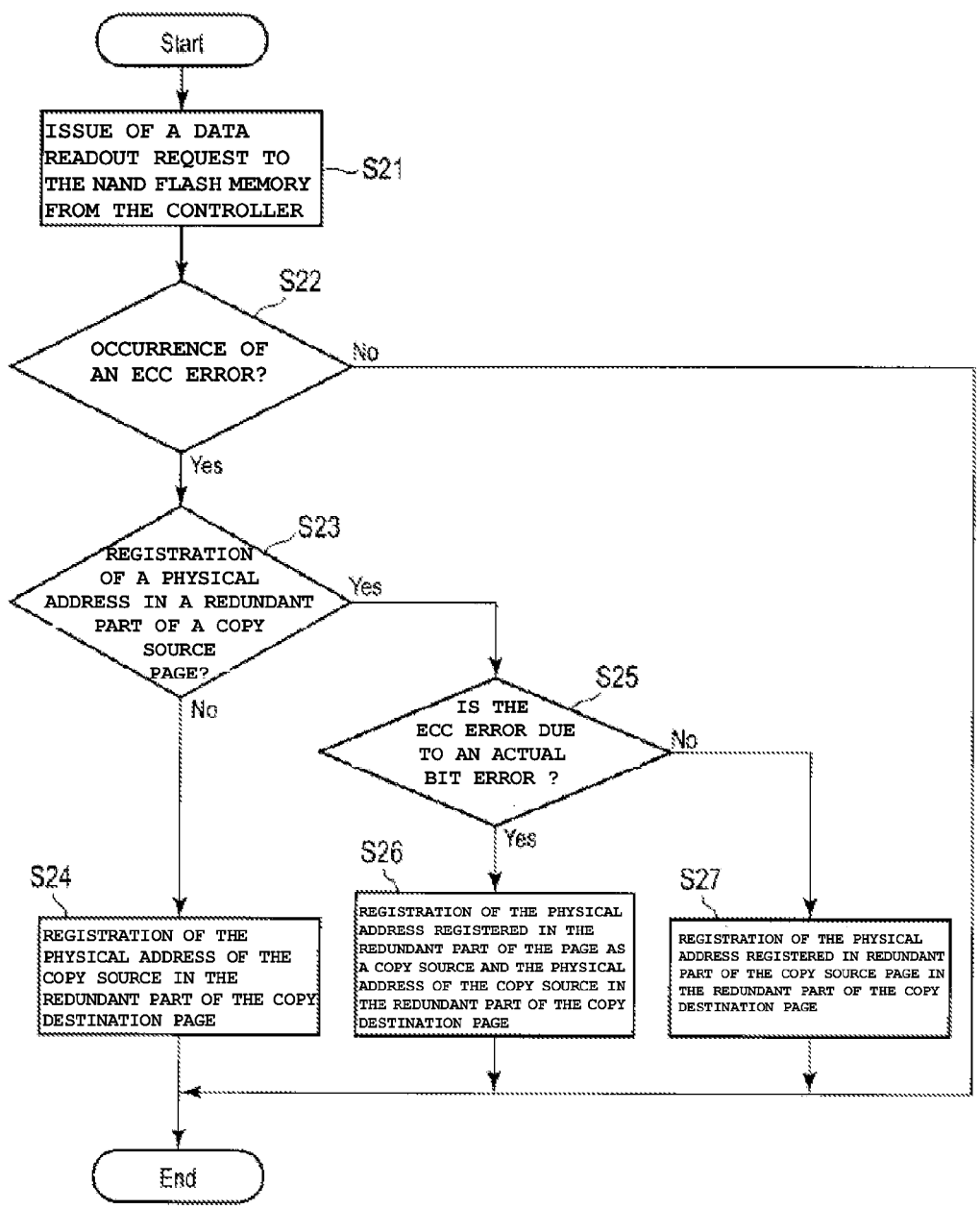
FIG. 9 is a flow chart showing the case in which addresses are registered in the page in the second embodiment.

However, for example, instead of the request from the host device, when a readout is implemented by a data copy through background processing, etc., from the memory controller 20 and an ECC error is detected, a registration processing of the physical block address is implemented according to a flow chart shown in FIG. 9.

First, the controller 20 issues a readout request to a page, hereinafter referred to as a copy source page, in the NAND type flash memory 10 (step S21). Next, whether or not there is an ECC error in the data read out of the copy source page is decided (step S22). Specifically, the controller 20 decides whether or not an uncorrectable error is included in the read data and whether or not a flag showing that the ECC error occurred in the past is set among flags that are managed by the firmware for the controller 20. Next, in at least the case in which the uncorrectable error is included or the case in which the flag is set, it is decided that the ECC error has occurred.

If no ECC error occurs in the data read out of the copy source page, the registration processing is finished. On the other hand, if the ECC error occurs in the data read out of the copy source page, the controller 20 decides whether or not the physical block address, at which the ECC error occurred in the past, is registered in the redundant part 16 of the copy source page (step S23).

If no physical block address is registered in the redundant part 16 of the copy source page, the physical block address of the copy source page is registered in the empty area 16B of the redundant part 16 of a copy destination page (step S24), finishing the processing.

On the other hand, at step S23, if the physical block address has already been registered in the redundant part 16 of the copy source page, the controller 20 decides whether or not the ECC error that occurred in the read data is an actual ECC error containing an uncorrectable error due to a bit error excess. In other words, in this case, when the ECC code is recalculated for the read data copied from the physical block containing the ECC error and an error is detected, the controller 20 decides whether or not the data include an uncorrectable error. Next, the controller 20 decides among the flags that are managed by the firmware, whether or not a flag showing that the ECC error occurred in the past, is set. When only the read data includes the uncorrectable error (i.e., ECC error did not occur in the past) is the error decided as an actual ECC error (step S25).

If the ECC error occurred is an actual ECC error, the physical block address registered in the redundant part 16 of the copy source page and the physical block address of the copy source page are registered in the empty area 16B of the redundant part 16 of the copy destination page. In other words, the physical block address, which has already been registered in the redundant part 16 of the copy source page, is continuously registered in the empty area 16B of the redundant part 16 of the copy destination page, and the physical block address at which the error occurs currently is registered (step S26), finishing the processing.

On the other hand, at step S25, if the ECC error occurred is not an actual ECC error, the physical block address registered in the redundant part 16 of the copy source page is registered in the empty area 16B of the redundant part 16 of the copy destination page (step S27), finishing the processing.

In this manner, the processing for registering a physical block address in the redundant part of the page in the case in which an ECC error occurs is finished.

As mentioned above, even if a physical block containing a page, in which a physical block address has already been registered in a redundant part, is copied in another physical block, there is a possibility that an actual ECC error due to a bit error has occurred in the physical block which is a copy destination. In this case, it is also necessary to register the physical block address, at which the ECC error occurs currently, as the second address in addition to the first physical block address in which the ECC error occurred in the past.

Therefore, for example, even if the physical block in which the ECC error has occurred is copied many times in another physical block, the physical block in which the ECC error has actually occurred can be identified.

In addition, when the physical block address is registered in the redundant part of a page of the NAND type flash memory 10, as part of another process, all the physical block addresses where an error has occurred may be continuously registered in the redundant part of the page.

Figure 10:
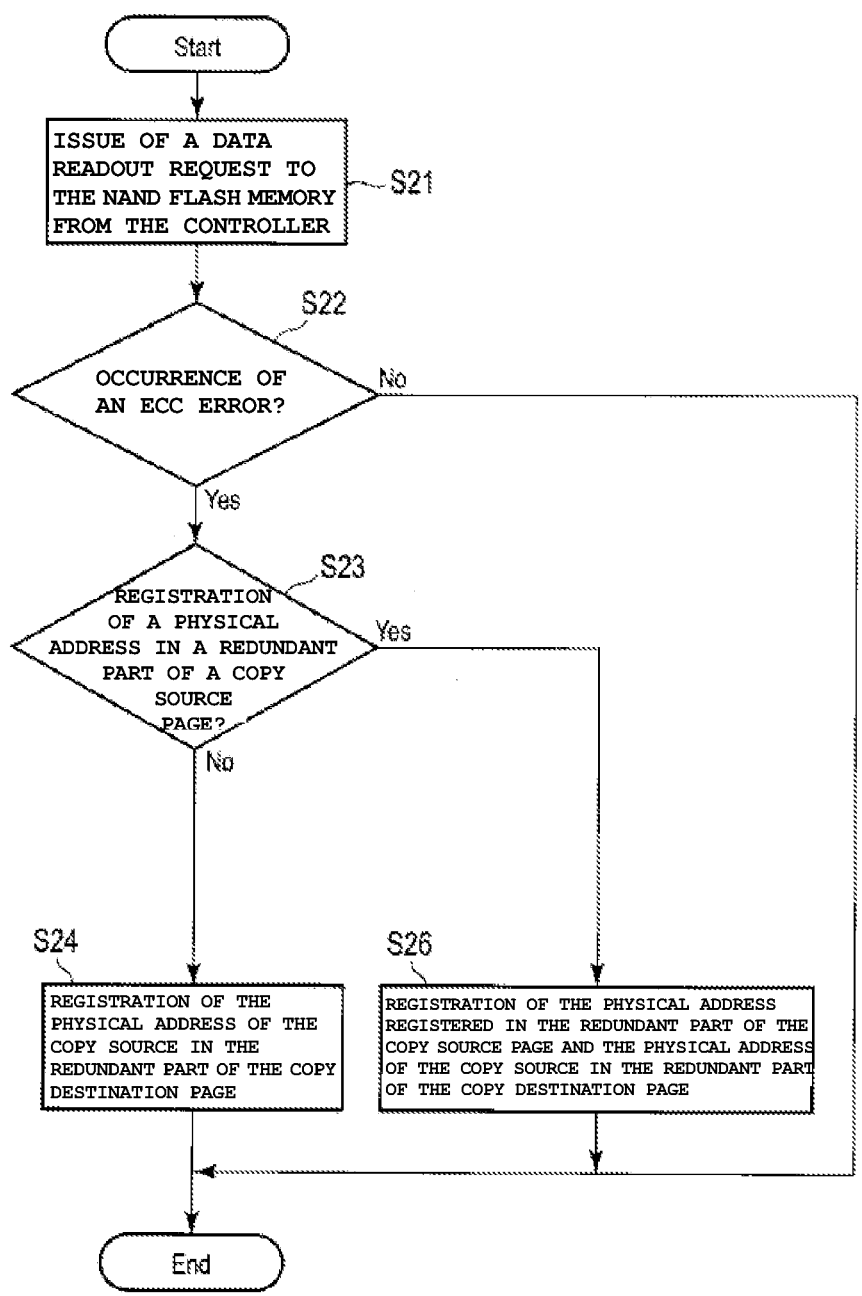
FIG. 10 is another flow chart showing the case in which addresses are registered in the page in the second embodiment.

FIG. 10 is a flow chart showing the case in which all physical addresses at which an error has occurred are registered in the redundant part of a page.

In FIG. 9, in case the ECC error is not an actual ECC error, the processing has been finished without registering its physical block address in the redundant part 16 of the page. However, in the processing shown in FIG. 10, whether or not an ECC error occurs in read data is decided (step S22). If the ECC error occurs, the physical block address registered in the redundant part of the copy source page, where the ECC error has occurred, and the physical block address of the copy source page is registered in the redundant part of the copy destination page, regardless of whether or not the error is ECC error (step S26).

In this manner, the physical block addresses of the process as well as the physical block address where the ECC error actually occurred may be similarly registered. Therefore, even in the case in which the ECC error data are repeatedly copied, the access history of the physical block address at which the error has occurred can be understood, thus being able to use the history as a clue for interpreting the error. In other words, in this case, the history of all the addresses after the occurrence of the ECC error can be tracked, thus being able to be useful for the interpretation of the error.

According to the second embodiment, since a physical address at which an error has occurred is registered in the redundant part of a page in a block of the NAND type flash memory, the physical block in which the ECC error actually occurred can be identified. In addition, if the physical addresses of the process are similarly registered in addition to the physical address where the ECC error actually occurred, the access sequence can also be confirmed. In this embodiment, the physical blocks in which the ECC error has actually occurred can be retraced and identified from the physical block that is currently used.

As explained above, in the embodiments, the physical address at which an ECC error has occurred is managed by the system table in the NAND type flash memory as an error block table, or the physical address at which the ECC error has occurred is managed by the redundant part of a page of the NAND type flash memory, so that even if the ECC error occurs at the time of data copy, etc., in the background processing of a controller as well as a request from a host device, the physical address where the ECC error has actually occurred can be identified.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A storage device comprising:
a nonvolatile memory having multiple blocks, each block including multiple pages;
an error correcting circuit that is configured to detect and correct an error in data read out from a block of the nonvolatile memory at a location referenced by a logical address and issue a notification of an error occurrence when the error cannot be corrected; and
a processing circuit for controlling the operations of the error correcting circuit and the nonvolatile memory, wherein
when the notification of the error occurrence is received from the error correcting circuit for the data read out of a page in a first block of the nonvolatile memory, the processing circuit records a physical address of the page in the first block in a free part of a page in a second block of the nonvolatile memory into which the read data are to be written.

2. The storage device according to claim 1, wherein when the notification of the error occurrence is received from the error correcting circuit, the processing circuit further records the physical address, which has been registered in a free part of the page in the first block, in the free part of the page in the second block.

3. The storage device according to claim 1, wherein when the notification of the error occurrence is received from the error correcting circuit, the processing circuit records the physical address of the page in the first block in the free part of the page in the second block of the nonvolatile memory into which the read data are written without determining whether or not the error is an actual error.

4. The storage device according to claim 1, wherein when the notification of the error occurrence is received from the error correcting circuit, the processing circuit determines whether or not the error is an actual error and records the physical address of the page in the first block in the free part of the page in the second block of the nonvolatile memory into which the read data are written if the error is an actual error.

5. The storage device according to claim 4, wherein the processing circuit determines that the error is not an actual error if the physical address of the page in the first block is indicated as associated with an uncorrectable error occurrence in the past.

6. The storage device according to claim 4, wherein the processing circuit determines that the error is an actual error if the physical address of the page in the first block is not indicated as associated with an uncorrectable error occurrence in the past.

7. The storage device according to claim 1, wherein when the notification of the error occurrence is received from the error correcting circuit for the data read out of the page in the first block of the nonvolatile memory, the processing circuit records a physical address recorded in a free part of the page in the first block in the free part of the page in the second block of the nonvolatile memory into which the read data are to be written.

* * * * *